United States Patent [19]
Hirata

[11] Patent Number: 5,703,509
[45] Date of Patent: Dec. 30, 1997

[54] FREQUENCY MULTIPLIER CIRCUIT

[75] Inventor: Masaru Hirata, Tokyo, Japan

[73] Assignee: NEC Corporation, Tokyo, Japan

[21] Appl. No.: 696,622

[22] Filed: Aug. 14, 1996

[30] Foreign Application Priority Data

Aug. 14, 1995 [JP] Japan .................................. 7-228571

[51] Int. Cl.$^6$ .................................................. H03B 19/00
[52] U.S. Cl. ........................................... 327/119; 327/122
[58] Field of Search .................................. 327/113, 114, 327/116, 119, 120, 122, 231, 238, 254, 255, 355

[56] References Cited

U.S. PATENT DOCUMENTS

| | | | |
|---|---|---|---|
| 5,317,276 | 5/1994 | Yamamoto | 327/254 |
| 5,392,016 | 2/1995 | Nishida et al. | 327/122 |
| 5,559,457 | 9/1996 | Uda et al. | 327/116 |

*Primary Examiner*—Timothy P. Callahan
*Assistant Examiner*—Jeffrey Zweizig
*Attorney, Agent, or Firm*—Sughrue, Mion, Zinn, Macpeak & Seas, PLLC

[57] ABSTRACT

A frequency multiplier circuit that needs no coupling capacitors and no input bias circuits for a next-stage circuit, which includes a phase-shifted signal generator, first and second differential amplifiers, and a multiplier. The phase-shifted signal generator receives an initial input signal and generates first and second output signals whose phases are shifted by 90° with each other. The first differential amplifier amplifies the first output signal to output a first positive-phase output signal and a first negative-phase output signal. The second differential amplifier amplifies the second output signal to output a second positive-phase output signal and a second negative-phase output signal. The multiplier multiplies the first and second positive-phase output signals to output a third positive-phase output signal as a positive-phase output of the frequency multiplier circuit. At the same time, it multiplies the first and second negative-phase output signals to output a third negative-phase output signal as a negative-phase output of the frequency multiplier circuit. Each of the third positive- and negative-phase output signals has a doubled frequency of the initial input signal and substantially the same dc offset voltage.

6 Claims, 6 Drawing Sheets

FREQUENCY MULTIPLIER CIRCUIT

BACKGROUND OF THE INVENTION

1. Field of the Invention

The present invention relates to a frequency multiplier circuit and more particularly, to a frequency multiplier circuit including a multiplier subcircuit for multiplying two input signals, which is effectively formed on a monolithic Large-Scale Integrated circuit device (LSI).

2. Description of the Prior Art

Figure 1:
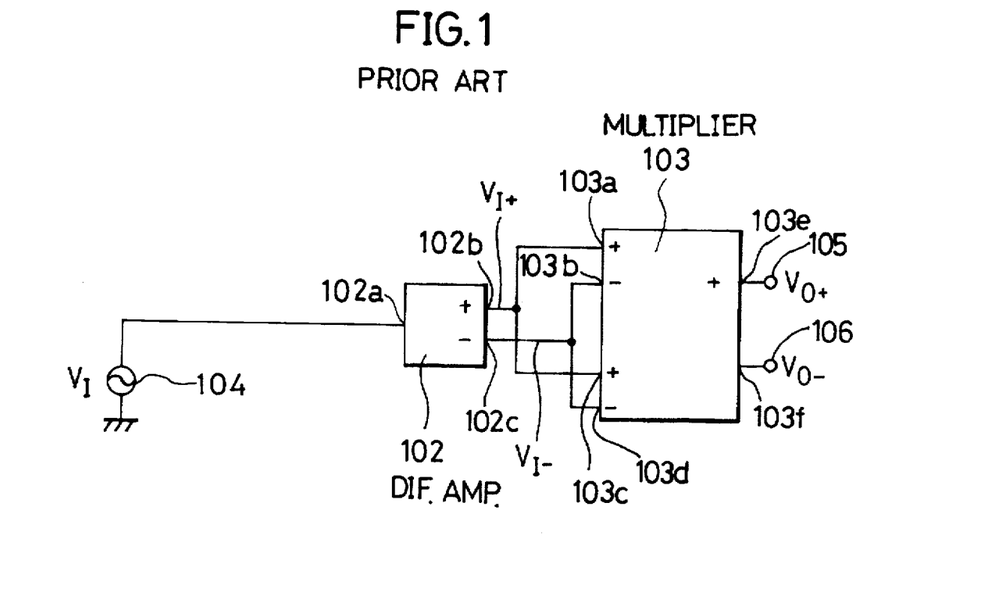
FIG. 1 is a block diagram showing the configuration of a conventional frequency multiplier circuit.

FIG. 1 shows a conventional frequency multiplier circuit, in which an initial input voltage $V_I$ is inputted from a signal source 104 into a differential amplifier 102 through an input terminal 102a.

The differential amplifier 102 amplifies the input voltage $V_I$ thus inputted to output a positive-phase output voltage $V_{I+}$ and a negative-phase output voltage $V_{I-}$ through a positive-phase output terminal 102b and a negative-phase output terminal 102c, respectively.

The positive-phase output voltage $V_{I+}$ and the negative-phase output voltage $V_{I-}$ are inputted into a multiplier 103 through a first pair of input terminals 103a and 103b and a second pair of input terminals 103c and 103d. Specifically, the positive-phase output voltage $V_I$ is inputted into the multiplier 103 through the positive-phase input terminals 103a and 103c. The negative-phase output voltage $V_{I-}$ is inputted into the multiplier 103 through the negative-phase input terminals 103b and 103d.

The multiplier 103 is typically composed of a well-known Gilbert multiplier.

The multiplier 103 multiplies the inputted output voltages $V_{I+}$ and $V_{I-}$ to thereby output differentially a positive-phase output voltage $V_{O+}$ and a negative-phase output voltage $V_{O-}$ at a pair of positive- and negative-phase output terminals 103e and 103f, respectively.

If the initial input voltage $V_I$ is defined as $$V_I = E_O \sin(\omega t) \quad (1)$$

where $E_O$ is the amplitude, $\omega$ is the angular frequency, and t is the time, the output voltages $V_{I+}$ and $V_{I-}$ of the differential amplifier 102 are given by the following equations (2) and (3), respectively, where $E_1$ is the amplified amplitude.

$$V_{I+} = E_1 \sin(\omega t) \quad (2)$$

$$V_{I-} = -E_1 \sin(\omega t) \quad (3)$$

Therefore, the output voltages $V_{O+}$ and $V_{O-}$ of the multiplier 103 are given by the following equations (4) and (5), respectively, where $E_2$ is the amplitude.

$$\begin{aligned}V_{o+} &= E_2 \sin(\omega t) \cdot E_2 \sin(\omega t) \quad (4)\\ &= (-1/2)E_2^2 \cos(2\omega t) + (1/2)E_2^2\\ V_{o-} &= -E_2 \sin(\omega t) \cdot E_2 \sin(\omega t) \quad (5)\\ &= (+1/2)E_2^2 \cos(2\omega t) - (1/2)E_2^2\end{aligned}$$

Figure 2:
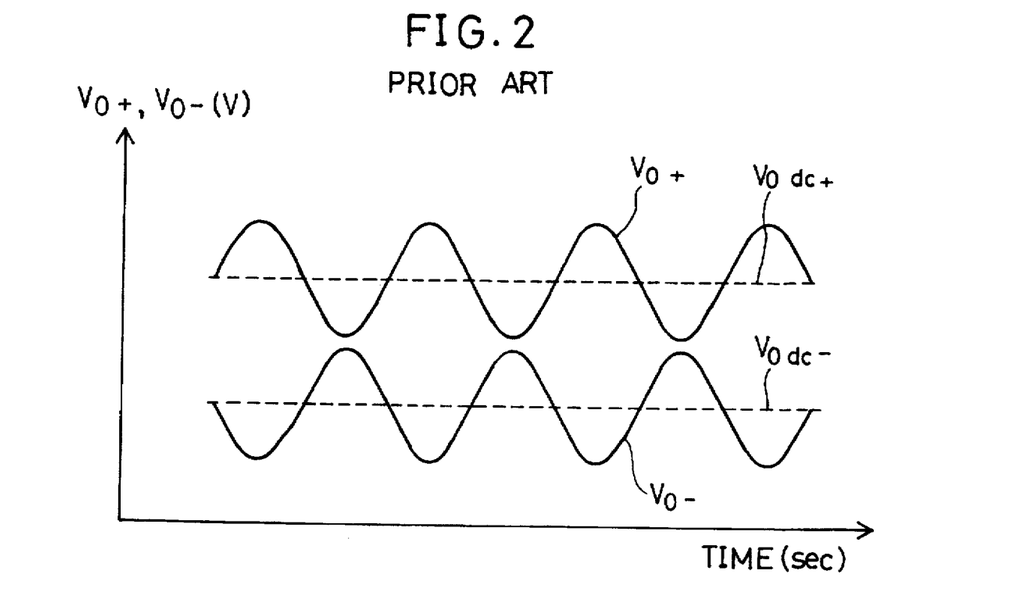
FIG. 2 is a time chart showing the waveform of the positive- and negative-phase output signals of the conventional frequency multiplier circuit shown in FIG. 1.

The waveforms of the output voltages $V_{O+}$ and $V_{O-}$ are shown in FIG. 2.

It is seen from the equations (4) and (5) that each of the output voltages $V_{O+}$ and $V_{O-}$ has a doubled frequency of $2\omega$ and that the positive-phase output voltage $V_{O+}$ has an offset voltage $V_{Odc+}$ of $(+\frac{1}{2})E_2^2$ and the negative-phase output voltage $V_{O-}$ has an offset voltage $V_{Odc-}$ of $(-\frac{1}{2})E_2^2$.

With the conventional frequency multiplier circuit shown in FIG. 1, the positive- and negative-phase output voltages $V_{O+}$ and $V_{O-}$ has different offset voltages of $(+\frac{1}{2})E_2^2$ and $(-\frac{1}{2})E_2^2$. Therefore, a problem that the conventional frequency multiplier circuit of FIG. 1 needs to have coupling capacitors and input bias circuits for a next-stage circuit occurs. This problem leads to the current consumption increase and circuit scale enlargement.

SUMMARY OF THE INVENTION

Accordingly, an object of the present invention is to provide a frequency multiplier circuit that needs no coupling capacitors and no input bias circuits for a next-stage circuit.

The above object together with others not specifically mentioned will become clear to those skilled in the art from the following description.

A frequency multiplier circuit according to a first aspect of the present invention comprises a phase-shifted signal generator, first and second differential amplifiers, and a multiplier.

The phase-shifted signal generator receives an initial input signal and generates first and second output signals whose phases are shifted by 90° with each other.

The first differential amplifier amplifies the first output signal to output a first positive-phase output signal and a first negative-phase output signal.

The second differential amplifier amplifies the second output signal to output a second positive-phase output signal and a second negative-phase output signal.

The multiplier receives the first and second positive-phase output signals and multiplies the first and second positive-phase output signals to output a third positive-phase output signal as a positive-phase output of the frequency multiplier circuit. At the same time, it receives the first and second negative-phase output signals and multiplies the first and second negative-phase output signals to output a third negative-phase output signal as a negative-phase output of the frequency multiplier circuit.

Each of the third positive- and negative-phase output signals has a doubled frequency of the initial input signal and substantially the same dc offset voltage.

With the frequency multiplier circuit according to the first aspect of the present invention, since the first differential amplifier receives the first output signal generated by the phase-shifted signal generator and outputs the first positive-phase signal and the first negative-phase output signal, the phase of the first negative-phase output signal is shifted by 180° with respect to that of the first positive-phase output signal.

Similarly, since the second differential amplifier receives the second output signal generated by the phase-shifted signal generator and outputs the second positive-phase output signal and the second negative-phase output signal, the phase of the second negative-phase output signal is shifted by 180° with respect to that of the second positive-phase output signal.

Here, the phase of the second output signal is shifted by 90° with respect to that of the first output signal and as a result, the phase of the second positive-phase output signal is shifted by 90° with respect to that of the first positive-phase output signal, and the phase of the second negative-phase output signal is shifted by 270° with respect to that of the first positive-phase output signal.

Since the multiplier multiplies the first positive-phase output signal and the second positive-phase output signal to output the third positive-phase output signal, and at the same time, it multiplies the first negative-phase output signal and the second negative-phase output signal to output the third negative-phase output signal. As a result, each of the third positive- and negative-phase output signals has the doubled frequency of the initial input signal and the same dc offset voltage.

Accordingly, the frequency multiplier circuit according to the first aspect needs no coupling capacitors and no input bias circuits for a next-stage circuit.

In a preferred embodiment of the circuit according to the first aspect, the phase-shifted signal generator includes an integrator and a differentiator connected in parallel.

In this case, the integrator has a first resistor and a first capacitor and the differentiator has a second resistor and a second capacitor. The first and second resistors have the same resistance value. The first and second capacitors have the same capacitance value.

A frequency multiplier according to a second aspect of the present invention comprises a differential amplifier, first and second phase-shifted signal generators, and a multiplier The differential amplifier receives an initial input signal and amplifies the initial input signal to output first positive-phase output signal and a first negative-phase output signal.

The first phase-shifted signal generator receives the first positive-phase output signal and generates first and second output signals whose phases are shifted by 90° with each other.

The second phase-shifted signal generator receives the first negative-phase output signal and generates third and fourth output signals whose phases are shifted by 90° with each other.

The multiplier receives the first and second output signals and multiplies the first and second output signals to output a second positive-phase output signal as a positive-phase output of the frequency multiplier circuit. At the same time, it receives the third and fourth output signals and multiplies the third and fourth output signals to output a second negative-phase output signal as a negative-phase output of the frequency multiplier circuit.

Each of the second positive- and negative-phase output signals has a doubled frequency of the initial input signal and substantially the same dc offset voltage.

With the frequency multiplier according to the second aspect of the present invention, the phases of the first positive- and negative-phase output signals of the differential amplifier are shifted by 180° with each other. The first positive- and negative-phase output signals are applied to the first and second phase-shifted signal generators, respectively.

Also, the phase of the second output signal of the first phase-shifted signal generator is shifted by 90° with respect to that of the first output signal. The phase of the fourth output signal of the second phase-shifted signal generator is shafted by 90° with respect to that of the third output signal.

Therefore, the phase of the third output signal is shifted by 180° with respect to that of the first output signal, and the phase of the fourth output signal is shifted by 270° with respect to that of the first positive-phase output signal.

Since the multiplier multiplies the first and second output signals to output the second positive-phase Output signal, and at the same time, multiplies the third and fourth output signal to output the second negative-phase output signal, each of the second positive- and negative-phase output signals has the doubled frequency of the initial input signal and the same dc offset voltage.

Accordingly, the frequency multiplier circuit according to the second aspect needs no coupling capacitors and no input bias circuits for a next-stage circuit.

In a preferred embodiment of the circuit according to the second aspect, the phase-shifted signal generator includes an integrator and a differentiator connected in parallel.

In this case, the integrator has a first resistor and a first capacitor and the differentiator has a second resistor and a second capacitor. The first and second resistors have the same resistance value. The first and second capacitors have the same capacitance value.

BRIEF DESCRIPTION OF THE DRAWINGS

In order that the invention may be readily carried into effect, it will now be described with reference to the accompanying drawings.

DETAILED DESCRIPTION OF THE PEERED EMBODIMENTS

Preferred embodiments of the present invention will be described in detail below while referring to FIGS. 3 to 9.

FIRST EMBODIMENT

Figure 3:
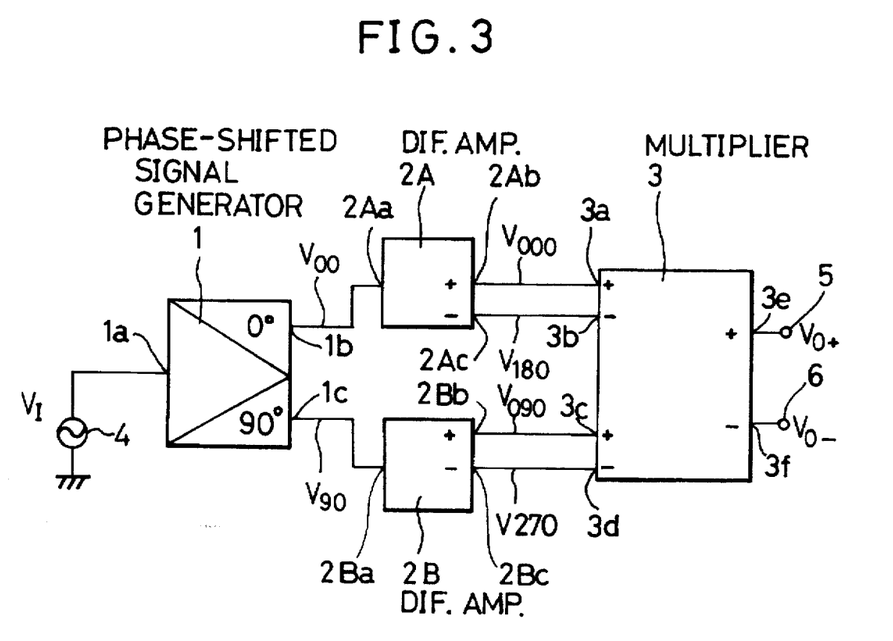
FIG. 3 is a block diagram showing the configuration of a frequency multiplier circuit according to a first embodiment of the present invention.

In FIG. 3, a frequency multiplier according to first embodiment of the present invention includes a phase-shifted signal generator 1, a first differential amplifier 2A, a second differential amplifier 2B, and a multiplier 3.

The phase-shifted signal generator 1 is applied with an initial input voltage $V_I$ from a signal source 4 through an input terminal 1a, and outputs a first output voltage $V_{00}$ through a first output terminal 1b and a second output voltage $V_{90}$ through a second output terminal 1c. The phases of the first and second output voltages $V_{00}$ and $V_{90}$ are shifted from each other by 90°. The frequencies and amplitudes of the first and second output voltages $V_{00}$ and $V_{90}$ are equal to each other.

The first differential amplifier 2A is applied with the first output voltage $V_{00}$ through an input terminal 2Aa and amplifies the voltage $V_{00}$ at a specific gain, thereby outputting differentially a first positive-phase output voltage $V_{000}$ through a positive-phase output terminal 2Ab and a first negative-phase output voltage $V_{180}$ through a negative-phase output terminal 2Ac.

The phase of the first negative-phase output voltage $V_{180}$ is shifted by 180° with respect to that of the first positive-phase output voltage $V_{000}$.

The second differential amplifier 2B is applied with the second output voltage $V_{90}$ through an input terminal 2Ba and amplifies the voltage $V_{90}$ at a specific gain, thereby outputting differentially a second positive-phase output voltage $V_{090}$ through a positive-phase output terminal 2Bb and a second negative-phase output voltage $V_{270}$ through a negative-phase output terminal 2Bc.

The phase of the second negative-phase output voltage $V_{270}$ is shifted by 180° with respect to that of the second positive-phase output voltage $V_{090}$.

Since the second output voltage $V_{90}$ is phase-shifted by 90° with respect to the first output voltage $V_{00}$, the second positive-phase output voltage $V_{090}$ is phase-shifted by 90° with respect to the first positive-phase output voltage $V_{000}$, and the second negative-phase output voltage $V_{090}$ is phase-shifted by 270° with respect to the first positive-phase output voltage $V_{000}$.

The multiplier 3 is applied with the first positive-phase output voltage $V_{000}$ and the first negative-phase output voltage $V_{180}$ through a first pair of input terminals 3a and 3b, and the second positive-phase output voltage $V_{090}$ and $V_{270}$ through a second pair of input terminals 3c and 3d. The multiplier 3 multiplies the output voltages $V_{000}$ and $V_{180}$ to output a positive-phase output voltage $V_{O+}$ through a positive-phase output terminal 3e. At the same time, the multiplier 3 multiplies the output voltages $V_{090}$ and $V_{270}$ to output a negative-phase output voltage $V_{O-}$ through a negative-phase output terminal 3f.

The positive-phase output voltage $V_{O+}$ and the negative-phase output voltage $V_{O-}$ are outputted through a pair of output terminals 5 and 6 of this frequency multiplier circuit as positive- and negative-phase outputs of this circuit, respectively.

Each of the positive- and negative-phase output voltages $V_{O+}$ and $V_-$ has a doubled frequency of the initial input voltage $V_I$.

Specifically, the first output voltage $V_{00}$ of the phase-shifted signal generator 1 is defined as $$V_{00}=A_0 \sin (\omega t) \quad (6)$$

where $A_0$ is the amplitude, $\omega$ is the angular frequency, and t is the time. Then, the second output voltage $V_{90}$ of the phase-shifted signal generator 1 is given by the following equation (7).

$$V_{90}=A_0 \sin (\omega t+\pi/2) \quad (7)$$

The first positive-phase output voltage $V_{000}$ and the first negative-phase output voltage $V_{160}$ of the first differential amplifier 2A are given by the following equations (8) and (9), respectively, $$V_{000}=A_1 \sin (\omega t) \quad (8)$$

$$V_{180}=A_1 \sin (\omega t+\pi) \quad (9)$$

where $A_1$ is the amplified amplitude.

Similarly, the second positive-phase output voltage $V_{090}$ and the second negative-phase output voltage $V_{270}$ of the second differential amplifier 2B are given by the following equations (10) and (11), respectively.

$$V_{090}=A_1 \sin (\omega t+\pi/2) \quad (10)$$

$$V_{270}=-A_1 \sin (\omega t+3\pi/2) \quad (11)$$

In the multiplier 3, the output voltages $V_{000}$ and $V_{090}$ are multiplied and the output voltages $V_{090}$ and $V_{270}$ are multiplied. Therefore, the positive- and negative-phase output voltages $V_{O+}$ and $V_{O-}$ of the multiplier 3 are given by the following equations (12) and (13), respectively, $$\begin{aligned} V_{O+} &= V_{000} \cdot V_{090} = A_1 \sin(\omega t) \cdot A_1 \sin(\omega t + \pi/2) \\ &= (A_1^2/2) \sin(2\omega t) \end{aligned} \quad (12)$$

$$\begin{aligned} V_{O-} &= V_{160} \cdot V_{270} = A_1 \sin(\omega t + \pi) \cdot A_1 \sin(\omega t + 3\pi/2) \\ &= -A_1 \sin(\omega t) \cdot A_1 \sin(\omega t + \pi/2) \\ &\quad (-A_1^2/2) \sin(2\omega t) \end{aligned} \quad (13)$$

Figure 4:
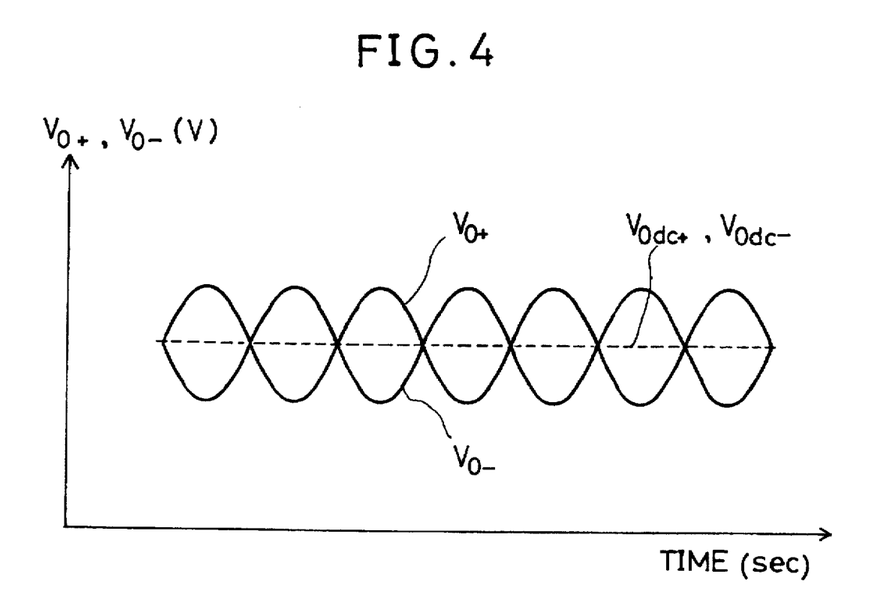
FIG. 4 is a time chart showing the waveform of the positive- and negative-phase output signals of the frequency multiplier circuit according to the first embodiment of the present invention.

The waveforms of the output voltages $V_{O+}$ and $V_{O-}$ are shown in FIG. 4.

It is seen from the equations (12) and (13) and FIG. 4 that each of the output voltages $V_{O+}$ and $V_{O-}$ has a dolled frequency of $2\omega$ of the input voltage $V_I$ and no dc offset voltage. Accordingly, no coupling capacitor and no input bias circuit are required for a next-stage circuit of this frequency multiplier circuit and as a result, when an LSI is constituted using the frequency multiplier of the first embodiment, the current consumption and circuit scale of the LSI can be decreased.

Figure 5:
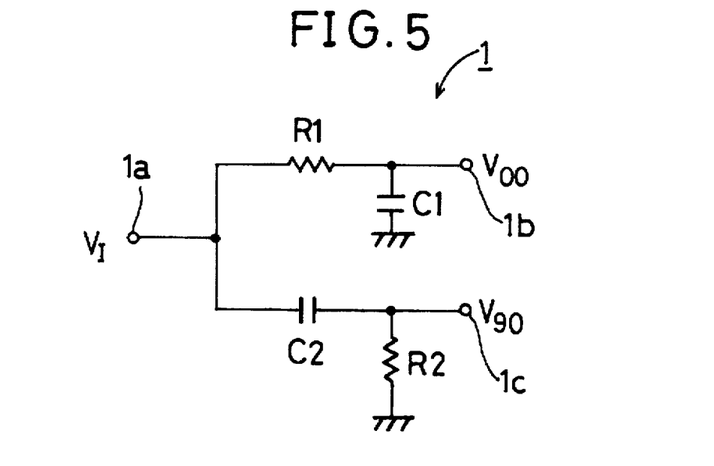
FIG. 5 is a circuit diagram of an example of the phase-shifted signal generator of the frequency multiplier circuit according to the first embodiment of the present invention.

FIG. 5 shows an example of the phase-shifted signal generator 1. In FIG. 5, one end of a resistor R1 and one end of a capacitor C2 are connected to the input terminal 1a. The other end of the resistor R1 is connected to the first output terminal 1b. The other end of the capacitor C2 is connected to the second output terminal 1c.

One end of a capacitor C1 is connected to the first output terminal 1b and the other end thereof is connected to the ground. One end of a resistor R2 is connected to the second output terminal 1c and the other end thereof is connected to the ground.

The resistor R1 and the capacitor C1 constitute an integrator for integrating the input voltage $V_I$. The capacitor C2 and the resistor R2 constitute a differentiator for differentiating the input voltage $V_I$. Therefore, it can be said that the phase-shifted signal generator 1 shown in FIG. 5 is composed of the parallel-connected integrator and differentiator.

Figure 6:
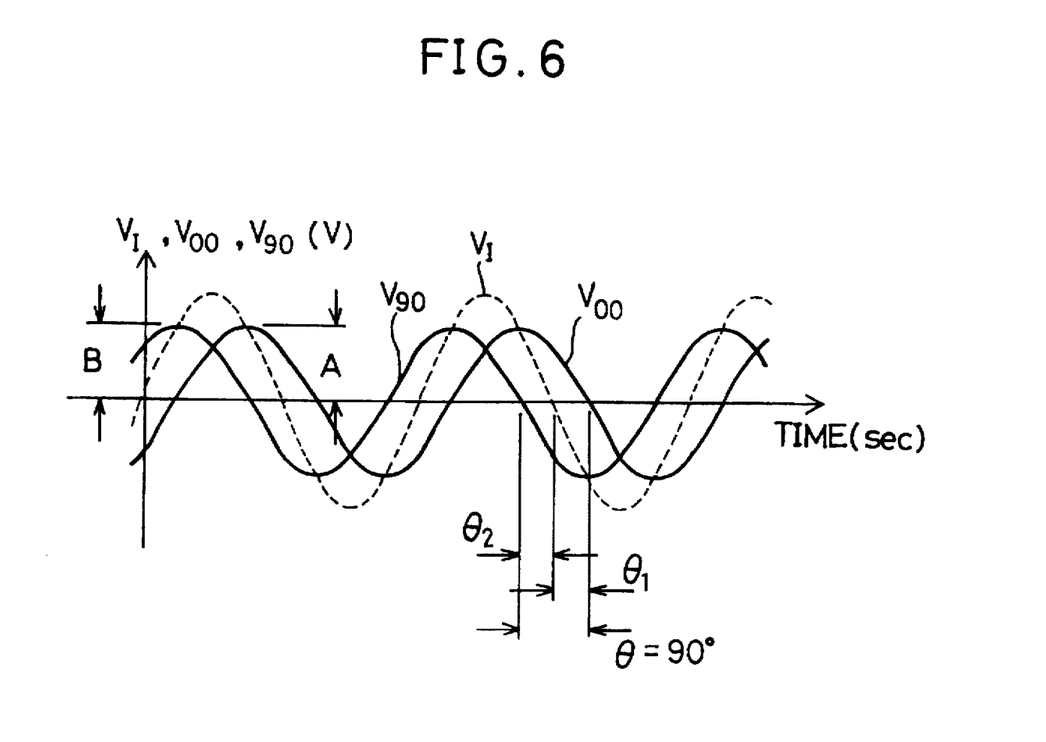
FIG. 6 is a time chart showing the waveform of the two phase-shifted output signals of the phase-shifted signal generator shown in FIG. 5.

Here, the resistors R1 and R2 have the same resistance value R and the capacitors C1 and C2 have the same capacitance value C. The values R and C are calculated from the relationship of CR=½πf, where f is the frequency of the initial input voltage $V_I$ and $2\pi f=\omega$ is established. Therefore, as shown in FIG. 6, the output voltage $V_{00}$ has a phase delay $\theta_1$ of 45° with respect to the input voltage $V_I$, and the output voltage $V_{90}$ has a phase lead $\theta_2$ of 45° with respect to the input voltage $V_I$. Thus, the two voltages $V_{00}$ and $V_{90}$ have a phase shift $\theta$ of 90°.

The output voltages $V_{00}$ and $V_{90}$ have the same amplitude and the same frequency as those of the input voltage $V_I$.

The relationship between the input voltage $V_I$ and the two output voltages $V_{00}$ and $V_{90}$ is illustrated in FIG. 6.

If the resistance values of the resistors R1 and R2 are different from each other and/or the capacitance values of the capacitors C1 and C2 are different from each other due to some cause, the two output voltages $V_{00}$ and $V_{90}$ will have different amplitudes. However, the resistors and capacitors formed in the LSI usually have very small fluctuation in resistance and capacitance, respectively, and as a result, the shifted phase of 90° can be practically kept.

Also, if the first and second output voltages $V_{00}$ and $V_{90}$ of the phase-shifted signal generator 1 have different amplitudes and consequently, the amplitude of the first output voltages $V_{000}$ and $V_{180}$ is different from that of the second output voltages $V_{090}$ and $V_{270}$, the positive- and negative-phase output voltages $V_{o+}$ and $V_{o-}$ are expressed by the following equations (14) and (15), respectively, $$V_{o+} = V_{000} \cdot V_{090} = A \sin(\omega t) \cdot B \sin(\omega t + \pi/2) \quad (14)$$
$$= (AB/2) \sin(2\omega t)$$

$$V_{o-} = V_{180} \cdot V_{270} = A \sin(\omega t + \pi) \cdot B \sin(\omega t + 3\pi/2) \quad (15)$$
$$= -A\sin(\omega t) \cdot B \sin(\omega t + \pi/2)$$
$$= (-AB/2) \sin(2\omega t)$$

where A is the amplitude of the output voltages $V_{000}$ and $V_{180}$ of the first differential amplifier 2A and B is the amplitude of the output voltages $V_{090}$ and $V_{270}$ of the second differential amplifier 2B.

It is seen from the equations (14) and (15) that each of the output voltages $V_{o+}$ and $V_{o-}$ has no dc offset voltage. Accordingly, the same advantages as those of the case where the first and second output voltages $V_{00}$ and $V_{90}$ are the same in amplitude.

Figure 7:
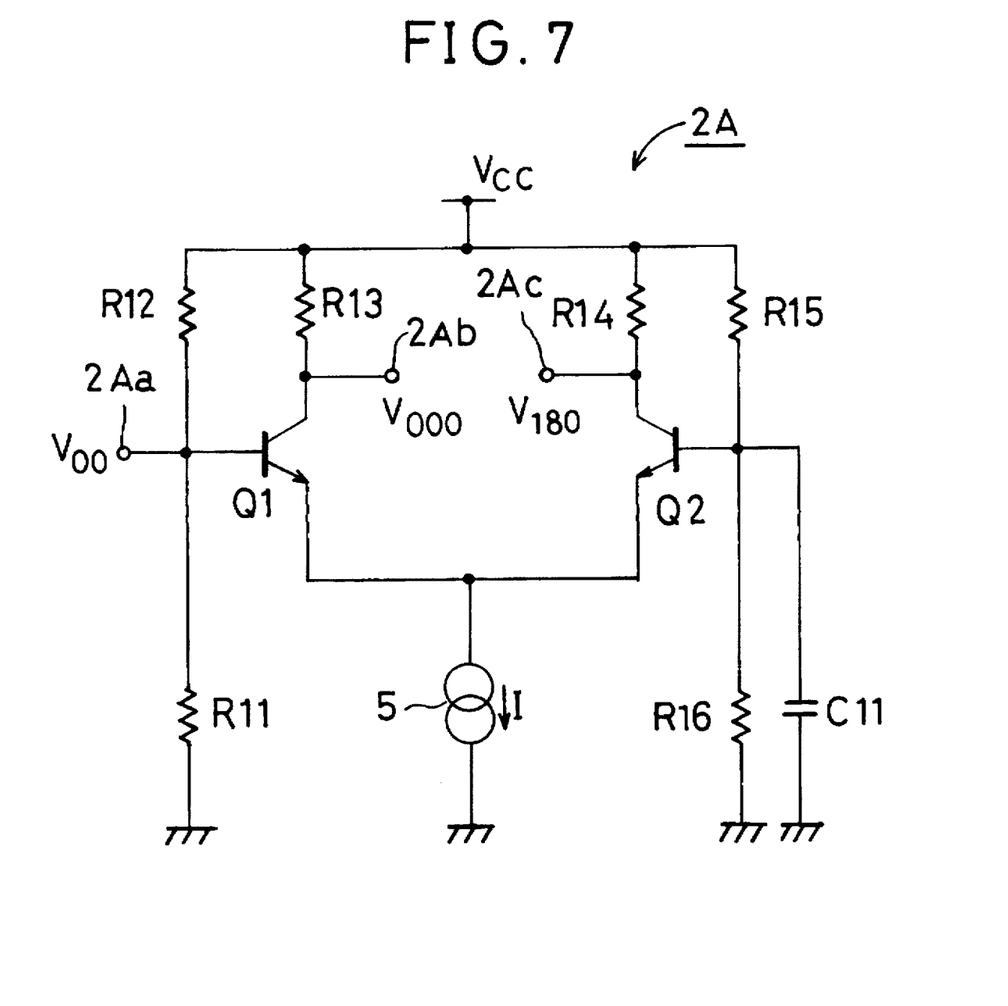
FIG. 7 is a circuit diagram of an example of the first and second differential amplifiers of the frequency multiplier circuit according to the first embodiment of the present invention.

FIG. 7 shows an example of the differential amplifier 2A. In FIG. 7, the differential amplifier 2A has a transistor pair of bipolar transistors Q1 and Q2 whose emitters are commonly connected to one end of a constant current source 5 (current value: I). The other end of the current source 5 is connected to the ground.

A collector of the transistor Q1 is connected to one end of a resistor R13 serving as a load of the transistor Q1. A collector of the transistor Q2 is connected to one end of a resister R14 serving as a load of the transistor Q2. The other ends of the resistors R13 and R14 are connected to a power supply (supply voltage value: $V_{cc}$). The collector of the transistor Q1 is connected to the output terminal 2Ab and the collector of the transistor Q2 is connected to the output terminal 2Ac.

A base of the transistor Q1 is connected to the input terminal 2Aa and one ends of resistors R11 and R12. The other end of the resistor R11 is connected to the ground. The other end of the resistor R12 is connected to the power supply. The resistors R11 and R12 constitute a bias circuit for the transistor Q1.

A base of the transistor Q2 is connected to one ends of resistors R15 and R16. The other end of the resistor R16 is connected to the ground. The other end of the resistor R15 is connected to the power supply. One end of a bypass capacitor C11 is connected to the base of the transistor Q2 and the other end thereof is connected to the ground. The resistors R15 and R16 and the capacitor C11 constitute a bias circuit for the transistor Q2.

The first output voltage $V_{00}$ of the phase-shifted signal generator i is inputted into the base of the transistor Q1. On the other hand, the base of the transistor Q2 is applied with a constant dc voltage.

The differential amplifier 2A differentially amplifies the output voltage $V_{00}$ to thereby output the first positive-phase output voltage $V_{000}$ at the output terminals 2Ab and the first negative-phase output voltage $V_{180}$ at the output terminal 2Ac.

The differential amplifier shown in FIG. 7 may be used as the second differential amplifier 2B.

Figure 8:
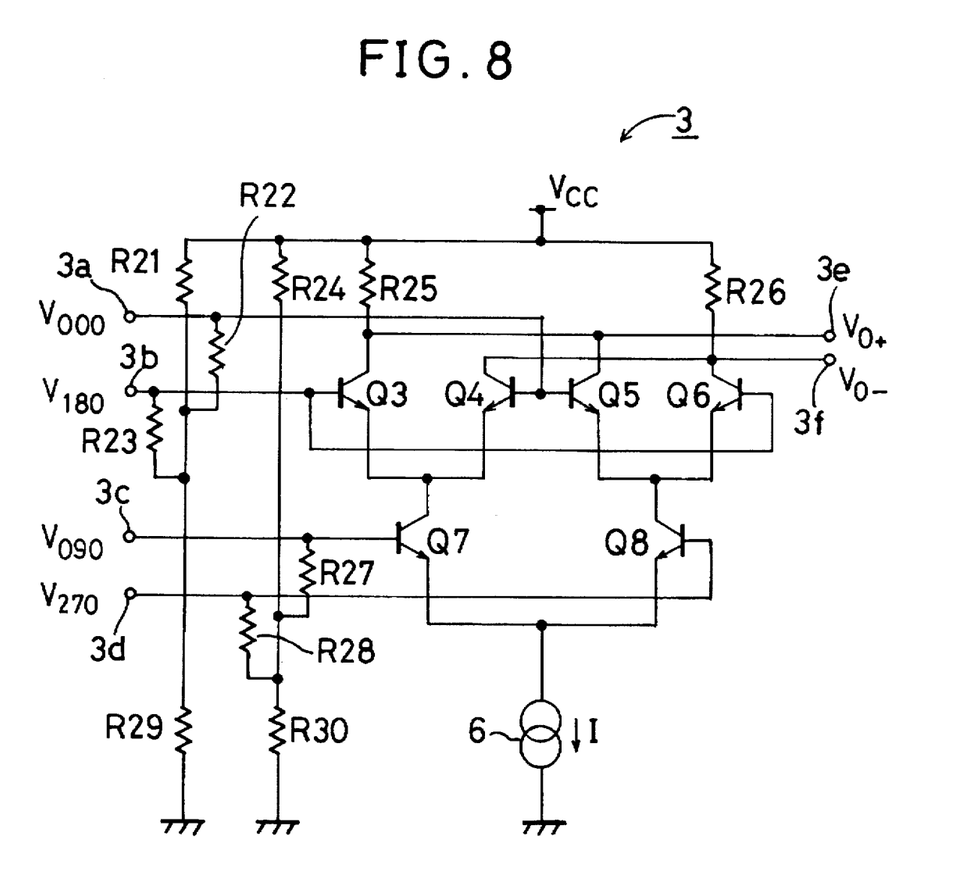
FIG. 8 is a circuit diagram of an example of the multiplier of the frequency multiplier circuit according to the first embodiment of the present invention, which is in the form of the Gilbert multiplier.

FIG. 8 shows an example of the multiplier 3, which is the well-known Gilbert multiplier.

In FIG. 8, the multiplier 3 has a first pair of bipolar transistors Q3 and Q4, a second pair of bipolar transistors Q5 and Q6, and a third pair of bipolar transistors Q7 and Q8.

Emitters of the transistors Q3 and Q4 are commonly connected to a collector of the transistor Q7. Emitters of the transistors Q5 and Q6 are commonly connected to a collector of the transistor Q8. Emitters of the transistors Q7 and Q8 are commonly connected to one end of a constant current source 6 (current value: I). The other end of the current source 6 is connected to the ground.

Base of the transistors Q4 and Q5 are commonly connected to the positive-phase input terminal 3a. Base of the transistors Q3 and Q6 are commonly connected to the negative-phase input terminal 3b. The collectors of the transistors Q3 and Q5 are commonly connected to the positive-phase output terminal 3e. The collectors of the transistors Q4 and Q5 are commonly connected to the negative-phase output terminal 3f.

A base of the transistor Q7 is connected to the positive-phase input terminal 3c. A base of the transistor Q8 is connected to the negative-phase input terminal 3d.

One end of a resistor R25 is connected to the coupled collectors of the Q3 and Q5, and the other end thereof is connected to the power supply. The resistor R25 serves as a load of the first pair of the transistors Q3 and Q4. One end of a resistor R26 is connected to the coupled collectors of the Q4 and Q6, and the other end thereof is connected to the power supply. The resistor R26 serves as a load of the second pair of the transistors Q5 and Q6.

Resistors R21, R22, R23, R24, R27, R28, R29 and R30 constitute a bias circuit. The serially-connected resistors R21 and R29 are connected to the power supply and the ground. One end of the resistor R22 is connected to the input terminal 3a and the other end thereof is connected to the connection point of the resistors R21 and R29. One end of the resistor R23 is connected to the input terminal 3b and the other end thereof is connected to the connection point of the resistors R21 and R29.

The serially-connected resistors R24 and R30 are connected to the power supply and the ground. One end of the resistor R27 is connected to the input terminal 3c and the other end thereof is connected to the connection point of the resistors R24 and R30. One end of the resistor R28 is connected to the input terminal 3d and the other end thereof is connected to the connection point of the resistors R24 and R30.

Thus, in the Gilbert multiplier shown in FIG. 8, the first positive-phase input voltage $V_{000}$ is applied to the coupled bases of the transistors Q4 and Q5, the first negative-phase input voltage $V_{180}$ is applied to the coupled bases of the transistors Q3 and Q6, the second positive-phase input voltage $V_{090}$ is applied to the base of the transistor Q7, and the second negative-phase input voltage $V_{270}$ is applied to the base of the transistor Q8. The positive-phase output voltage $V_{o+}$ is outputted at the output terminal 3e and the negative-phase output voltage $V_{o-}$ is outputted at the output terminal 3f.

SECOND EMBODIMENT

Figure 9:
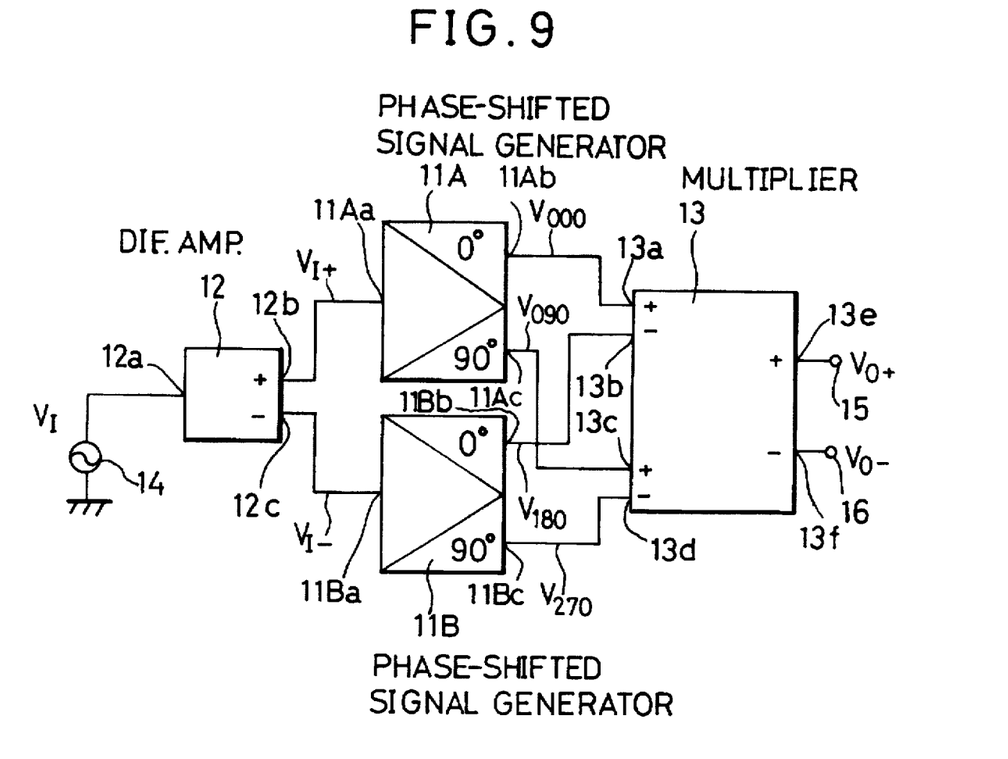
FIG. 9 is a block diagram showing the configuration of a frequency multiplier circuit according to a second embodiment of the present invention.

FIG. 9 shows a frequency multiplier according to a second embodiment of the present invention, in which one differential amplifier and two phase-shifted signal generators are provided.

As shown in FIG. 9, this frequency multiplier includes a differential amplifier 12, a first phase-shifted signal generator 11A, a second phase-shifted signal generator 11B, and a multiplier 13.

The differential amplifier 12 is applied with an initial input voltage $V_I$ from a signal source 14 through an input terminal 12a, and outputs a positive-phase output voltage $V_{I+}$ through a positive-phase output terminal 12b and a negative-phase output voltage $V_{I-}$ through a negative-phase output terminal 12c.

The output voltages $V_{I+}$ and $V_{I-}$ have the same phase, frequency and amplitude as those of the initial input voltage $V_I$.

The first phase-shifted signal generator 11A is applied with the positive-phase output voltage $V_{I+}$ through an input terminal 11Ad to output first and second output voltages $V_{O00}$ and $V_{O90}$ through output terminals 11Ab and 11Ac, respectively. The first and second output voltages $V_{O00}$ and $V_{O90}$ have the shifted phases by 90° and the same frequencies and amplitudes.

The second phase-shifted signal generator 11B is applied with the negative-phase output voltage $V_{I-}$ through an input terminal 11Ba and output third and fourth output voltages $V_{180}$ and $V_{270}$ through output terminals 11Bb and 11Bc, respectively. The third and fourth output voltages $V_{180}$ and $V_{270}$ have shifted phase by 90° and the same frequencies and amplitudes.

The multiplier 13 is applied with the first output voltage $V_{000}$ from the first phase-shifted signal generator 11A and the third output voltage $V_{180}$ from the second phase-shifted signal generator 11B through a first pair of input terminals 13a and 13b. At the same time, the multiplier 13 is applied with the second output voltage $V_{090}$ from the first phase-shifted signal generator 11A and the fourth output voltage $V_{270}$ from the second phase-shifted signal generator 11B through a second pair of input terminals 13c and 13d.

The multiplier 13 multiplies the first and third output voltages $V_{000}$ and $V_{180}$ to thereby output a positive-phase output voltage $V_{O+}$ through a positive-phase output terminal 13e. At the same time, the multiplier 13 multiplies the second and fourth output voltages $V_{090}$ and $V_{270}$ to thereby output a negative-phase output voltage $V_{O-}$ through a negative-phase output terminal 13f.

The positive-phase output voltage $V_{O+}$ and the negative-phase output voltage $V_{O-}$ are outputted through a pair of output terminals 15 and 16 of this frequency multiplier circuit, respectively.

Each of the positive- and negative-phase output voltages $V_{O+}$ and $V_{O-}$ has a doubled frequency $2\omega$ of the initial input voltage $V_I$.

Specifically, if the first output voltage $V_{000}$ is defined as $$V_{000} = A_0 \sin(\omega t) \quad (16)$$

where $A_0$ is the amplitude, the second, third and fourth output voltages $V_{090}$, $V_{180}$ and $V_{270}$ are given by the following equations (17), (18) and (19), respectively.

$$V_{090} = A_0 \sin(\omega t + \pi/2) \quad (17)$$

$$V_{180} = A_0 \sin(\omega t + \pi) \quad (18)$$

$$V_{270} = A_0 \sin(\omega t + 3\pi/2) \quad (19)$$

Therefore, the positive- and negative-phase output voltages $V_{O+}$ and $V_{O-}$ of the multiplier 13 are given by the following equations (20) and (21), respectively, $$\begin{aligned} V_{O+} &= V_{000} \cdot V_{090} = A_0 \sin(\omega t) \cdot A_0 \sin(\omega t + \pi/2) \\ &= (A_0^2/2) \sin(2\omega t) \end{aligned} \quad (20)$$

$$\begin{aligned} V_{O-} &= V_{180} \cdot V_{270} = A_0 \sin(\omega t + \pi) \cdot A_0 \sin(\omega t + 3\pi/2) \\ &= -A_0 \sin(\omega t) \cdot A_0 \sin(\omega t + \pi/2) \\ &= (-A_0^2/2) \sin(2\omega t) \end{aligned} \quad (21)$$

It is seen from the equations (20) and (21) that each of the output voltages $V_{O+}$ and $V_{O-}$ has a doubled frequency of $2\omega$ and no dc offset voltage. Accordingly, the same advantages as those of the first embodiment can be obtained.

Because only one differential amplifier whose power consumption is larger than that of the phase-shifted signal generator and the multiplier is necessary, the frequency multiplier circuit according to the second embodiment has an additional advantage that the power consumption can be further decreased than the circuit according to the first embodiment.

In the second embodiment, as the phase-shifted signal generator shown in FIG. 5, the differential amplifier shown in FIG. 7 and the multiplier shown in FIG. 8 may be used.

While the preferred forms of the present invention have been described, it is to be understood that modifications will be apparent to those skilled in the art without departing from the spirit of the invention. The scope of the invention, therefore, is to be determined solely by the following claims.

What is claimed is:

1. A frequency multiplier circuit comprising:

a phase-shifted signal generator for receiving an initial input signal to generate first and second output signals whose phases are shifted by 90° with each other;

a first differential amplifier for receiving said first output signal to amplify said first output signal and for outputting a first positive-phase output signal and a first negative-phase output signal;

a second differential amplifier for receiving said second output signal to amplify said second output signal and for outputting a second positive-phase output signal and a second negative-phase output signal;

a multiplier for receiving said first and second positive-phase output signals to multiply said first and second positive-phase output signals, outputting a third positive-phase output signal as a positive-phase output of said frequency multiplier circuit, receiving said first and second negative-phase output signals to multiply said first and second negative-phase output signals, and outputting a third negative-phase output signal as a negative-phase output of said frequency multiplier circuit;

wherein each of said third positive- and negative-phase output signals has a doubled frequency of said initial input signal and substantially the same dc offset voltage.

2. The circuit as claimed in claim 1, wherein said phase-shifted signal generator includes an integrator and a differentiator connected in parallel.

3. The circuit as claimed in claim 2, wherein said integrator has a first resistor and a first capacitor and said differentiator includes a second resistor and a second capacitor;

and wherein said first and second resistors have the same resistance value, and said first and second capacitors have the same capacitance value.

4. A frequency multiplier circuit comprising:

a differential amplifier for receiving an initial input signal to amplify said initial input signal and for outputting a first positive-phase output signal and a first negative-phase output signal;

a first phase-shifted signal generator for receiving said first positive-phase output signal to generate first and second output signals whose phases are shifted by 90° with each other;

a second phase-shifted signal generator for receiving said first negative-phase output signal to generate third and fourth output signals whose phases are shifted by 90° with each other; and a multiplier for receiving said first and second output signals to multiply said first and second output signals, outputting a second positive-phase output signal as a positive-phase output of said frequency multiplier circuit, receiving said third and fourth output signals to multiply said third and fourth output signals, and outputting a second negative-phase output signal as a negative-phase output of said frequency multiplier circuits, wherein each of said second positive- and negative-phase output signals has a doubled frequency of said initial input signal and substantially the same dc offset voltage.

5. The circuit as claimed in claim 4, wherein each of said phase-shifted signal generators includes an integrator and a differentiator connected in parallel.

6. The circuit as claimed in claim 5, wherein said integrator has a first resistor and a first capacitor and said differentiator includes a second resistor and a second capacitor;

and wherein said first and second resistors have the same resistance value, and said first and second capacitors have the same capacitance value.

\* \* \* \* \*